US012394483B2

(12) United States Patent
Prakash et al.

(10) Patent No.: US 12,394,483 B2
(45) Date of Patent: Aug. 19, 2025

(54) MEMORY DIE MANAGEMENT

(71) Applicant: Sandisk Technologies, Inc., Milpitas, CA (US)

(72) Inventors: Abhijith Prakash, Milpitas, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 536 days.

(21) Appl. No.: 17/746,068

(22) Filed: May 17, 2022

(65) Prior Publication Data

US 2023/0409230 A1    Dec. 21, 2023

(51) Int. Cl.
*G11C 16/04* (2006.01)
*G06F 3/06* (2006.01)

(52) U.S. Cl.
CPC ........ *G11C 16/0483* (2013.01); *G06F 3/0604* (2013.01); *G06F 3/0679* (2013.01)

(58) Field of Classification Search
CPC .. G11C 16/0483; G06F 3/0604; G06F 3/0679
USPC .................................................. 365/185.11
See application file for complete search history.

(56) References Cited

U.S. PATENT DOCUMENTS

| | | | |
|---|---|---|---|
| 7,512,507 B2* | 3/2009 | Gatzemeier | G11C 29/006 |
| | | | 702/117 |
| 7,911,849 B2 | 3/2011 | Hemink | |
| 9,030,885 B2 | 5/2015 | Wakchaure et al. | |
| 9,691,473 B2* | 6/2017 | Yang | G11C 13/025 |
| 9,760,307 B2 | 9/2017 | Avila et al. | |
| 2020/0118636 A1 | 4/2020 | Athreya et al. | |
| 2021/0004170 A1* | 1/2021 | Liikanen | G06F 3/0635 |
| 2022/0115079 A1* | 4/2022 | Sheperek | G11C 16/3422 |
| 2022/0328108 A1* | 10/2022 | Guo | G11C 5/14 |
| 2023/0129421 A1* | 4/2023 | Yang | G11C 16/3427 |
| | | | 365/185.02 |

\* cited by examiner

*Primary Examiner* — Sung Il Cho
(74) *Attorney, Agent, or Firm* — Michael Best & Friedrich LLP

(57) ABSTRACT

Memory die management based on biasing voltages. Some memory dies are formed of memory holes having a semi-circular shape. This semi-circular shape results in a decrease in biasing voltage compared to memory holes having a circular shape. Systems and methods described herein organize memory dies into memory die groups according to their biasing voltages. During operation, data is relocated between the memory die groups based on how often the data is read. Data may be scrambled within their respective memory die groups to maintain appropriate storage space.

5 Claims, 9 Drawing Sheets

MEMORY DIE MANAGEMENT

BACKGROUND

This application relates generally to data storage devices and, more particularly, to organizing memory dies based on characteristics of their stored memory to counter voltage downshifts on semi-circle memory holes.

Memory dies are formed by cutting memory holes within a sheet of metal. A drain-side select gate (SGD) associated with each memory hole is biased to set a voltage of the memory hole, and therefore a voltage at which data is stored. The memory dies are split into sections, or memory blocks, by a separating oxide. When the separating oxide cuts memory dies, the corresponding memory holes have a substantially semi-circular shape. Accordingly, each block includes memory holes having a circular shape and memory holes having a semi-circular shape.

SUMMARY

When a memory die experiences large quantity of read disturb events, the SGD lower tail voltage downshifts on semi-circle memory holes. As a result, in continued erase program cycles, a high number of noisy bits occur, resulting in an increase in fail bit count events. To offset this noise from read disturb events, embodiments described herein provide for organizing memory dies according to their biasing voltage value (VSG) related to a voltage threshold. Memory dies may be organized during memory die sorting, during packaging, or during operation. Additionally, memory dies may be organized based on how often data is being read.

The disclosure provides a data storage device including, in one embodiment, a memory interface and an electronic processor. The memory interface is configured to interface with a non-volatile memory, the non-volatile memory including a plurality of memory dies. Each of the memory dies includes a bias voltage value. The electronic processor is configured to compare the bias voltage value of each of the memory dies to a voltage threshold. The electronic processor is configured to assign memory dies having a bias voltage value greater than the voltage threshold to a first group of memory dies, and assign memory dies having a bias voltage value less than or equal to the voltage threshold to a second group of memory dies.

The disclosure also provides a method. In one embodiment, the method includes comparing the bias voltage value of each of a plurality of memory dies to a voltage threshold. The method includes assigning memory dies having a bias voltage value greater than the voltage threshold to a first group of memory dies, and assigning memory dies having a bias voltage value less than or equal to the voltage threshold to a second group of memory dies.

The disclosure also provides a memory device that supports organizing memory dies. The memory device comprises a memory and a controller. The memory includes at least a first memory die and a second memory die, the first memory die having a first bias voltage value and the second memory die having a second bias voltage value. The controller is configured to sort the first memory die into a first group and the second memory die into a second group.

In this manner, various aspects of the disclosure provide for improvements in at least the technical fields of data storage devices and their design and architecture. The disclosure can be embodied in various forms, including hardware or circuits controlled by firmware (i.e., code executing on a processor), and computer systems and networks; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware, stored in a non-transitory computer-readable medium, that is executed by processing or control circuitry), or any other suitable means. The following description is intended solely to give a general idea of various aspects of the disclosure, and does not limit the scope of the disclosure in any way.

Data Storage Devices

Figure 1:
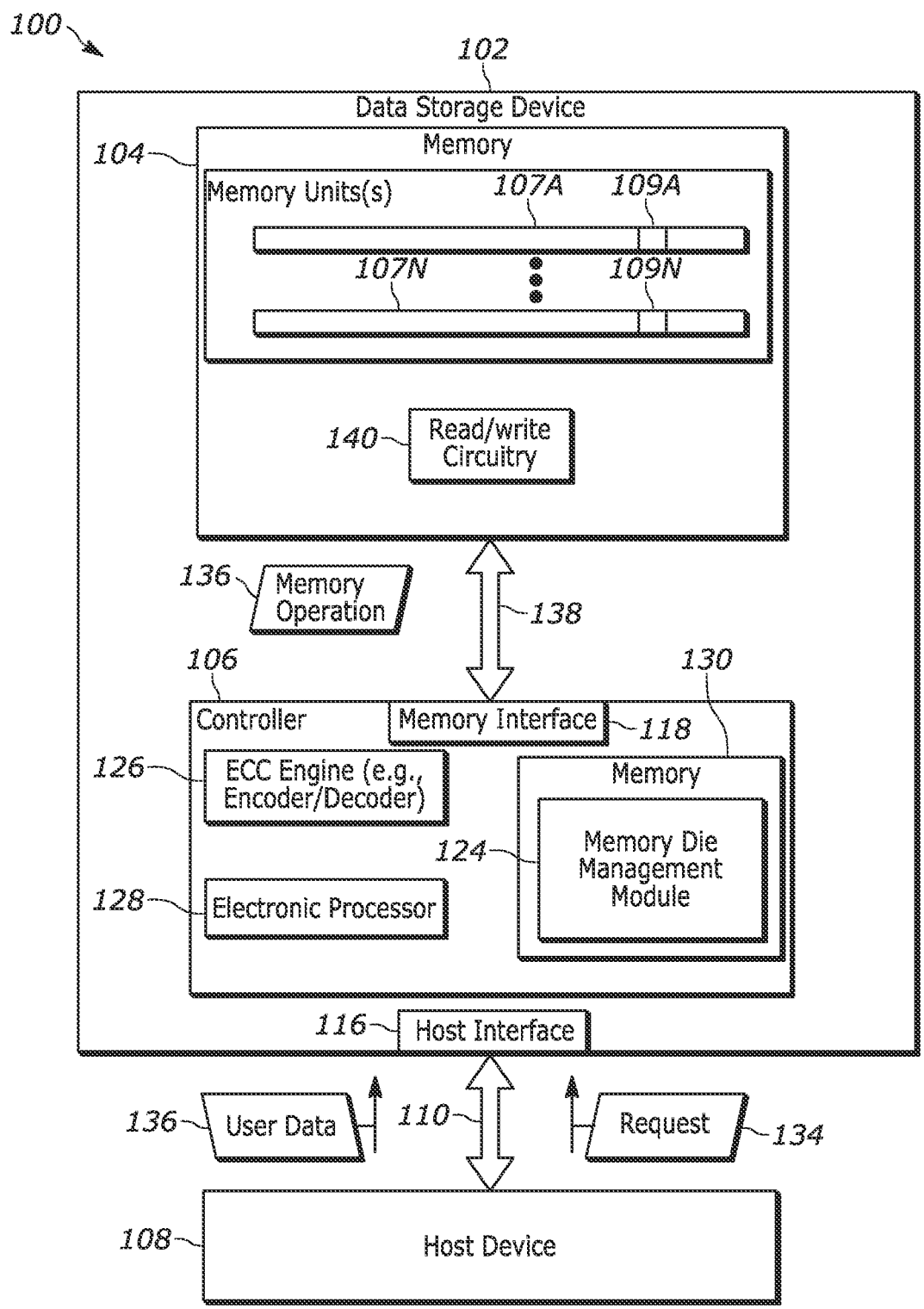
FIG. 1 is block diagram of a system including a data storage device with back pattern counter measures, in accordance with some embodiments of the disclosure.

FIG. 1 is a block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a memory 104 (e.g., a non-volatile memory) and a controller 106 (referred to hereinafter as "data storage device controller") coupled to the memory 104.

The data storage device 102 is coupled to a host device 108. The host device 108 is configured to provide data 110 (for example, user data 136) to the data storage device 102 to be stored, for example, in the memory 104. The host device 108 is, for example, a smart phone, a music player, a video player, a gaming console, an e-book reader, a personal digital assistance device, a tablet, a notebook computer, or another similar device.

In some implementations, the memory 104 is NAND flash memory. The memory 104 illustrated in FIG. 1 includes a plurality of memory units 107A-107N (for example, flash memory units). Each of the plurality of memory units 107A-107N includes a plurality of storage elements. For example, in FIG. 1, the memory unit 107A includes a representative storage element 109A. In some implementations, the storage element 109 is a multi-level cell flash memory, such as a 2 levels cell ("SLC"), a 4 levels cell ("MLC"), an 8 levels cell ("TLC"), a 16 levels cell ("QLC"), or a flash memory cell having a larger number of bits per cell (for example, between five and ten bits per cell). In some implementations, the plurality of memory units 107A-107N are memory dies configured to store data.

The data storage device controller 106 illustrated in FIG. 1 includes a host interface 116, a memory interface 118, an error code correction (ECC) engine 126, and an electronic processor 128. The data storage device controller 106 is illustrated in FIG. 1 in a simplified form. One skilled in the art would recognize that a controller for a non-volatile memory would include additional modules or components other than those specifically illustrated in FIG. 1. Additionally, although the data storage device 102 is illustrated in FIG. 1 as including the data storage device controller 106 and modules for performing, for example, flag setting, in other implementations, the data storage device controller 106 is instead located within the host device 108 or is otherwise separate from the data storage device 102. As a result, flash translation layer ("FTL") operations and flash module ("FM") operations that would normally be performed by the data storage device controller 106 (for example, wear leveling, bad block management, data scrambling, garbage collection, address mapping, etc.) can be performed by the host device 108 or another device that connects to the data storage device 102.

The data storage device controller 106 is configured to send data to, and receive data and instructions from, the host device 108 via the host interface 116. The host interface 116 enables the host device 108 to, for example, read from the memory 104 by transmitting requests 134 and to write to the memory 104 by sending user data 136 and using any suitable communication protocol. Suitable communication protocols include, for example, the Universal Flash Storage ("UFS") Host Controller Interface specification, the Secure Digital ("SD") Host Controller specification, etc.

The data storage device controller 106 is also configured to send data and commands to (e.g., the user data 136, the requests 134), and receive data from, the memory 104 with the memory interface 118. As an illustrative example, the data storage device controller 106 is configured to send data and a write command to instruct the memory 104 to store data in a particular memory location in the memory 104. The data storage device controller 106 is also configured to send a read command to the memory 104 to read data from a particular memory location in the memory 104. In some examples, the data storage device controller 106 is coupled to the non-volatile memory 104 with a bus 138 in combination with the memory interface 118.

The data storage device controller 106 illustrated in FIG. 1 includes an electronic processor 128 (for example, a microprocessor, a microcontroller, a field-programmable gate array ["FPGA"] semiconductor, an application specific integrated circuit ["ASIC"], or another suitable programmable device) and a non-transitory computer readable medium or memory 130 (for example, including random access memory ["RAM"] and read only memory ["ROM"]). The electronic processor 128 is operatively connected to the various modules within the data storage device controller 106 and the data storage device 102. For example, firmware is loaded in a ROM of the memory 130 as computer executable instructions. Those computer executable instructions are capable of being retrieved from the memory 130 and executed by the electronic processor 128 to control the operation of the data storage device 102 and perform the processes described herein (for example, flag setting and read operations). In some implementations, one or more modules of the data storage device controller 106 correspond to separate hardware components within the data storage device controller 106. In other implementations, one or more modules of the data storage device controller 106 correspond to software stored within the memory 130 and executed by the electronic processor 128. The memory 130 is configured to store data used by the electronic processor 128 during operation. For example, the memory 130 stores a memory die management module 124 implemented to trim and organize memory dies, as described below in more detail.

Memory Die Configuration and Downshifting Effect

Figure 2A:
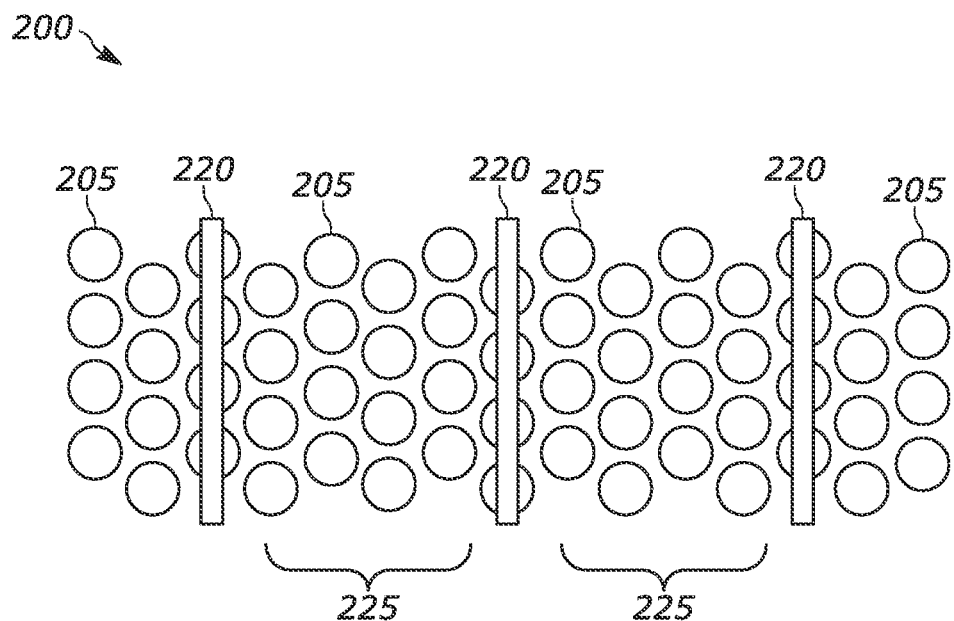
FIG. 2A is a top view of an example of a plurality of memory holes, in accordance with some embodiments of the disclosure.
Figure 2B:
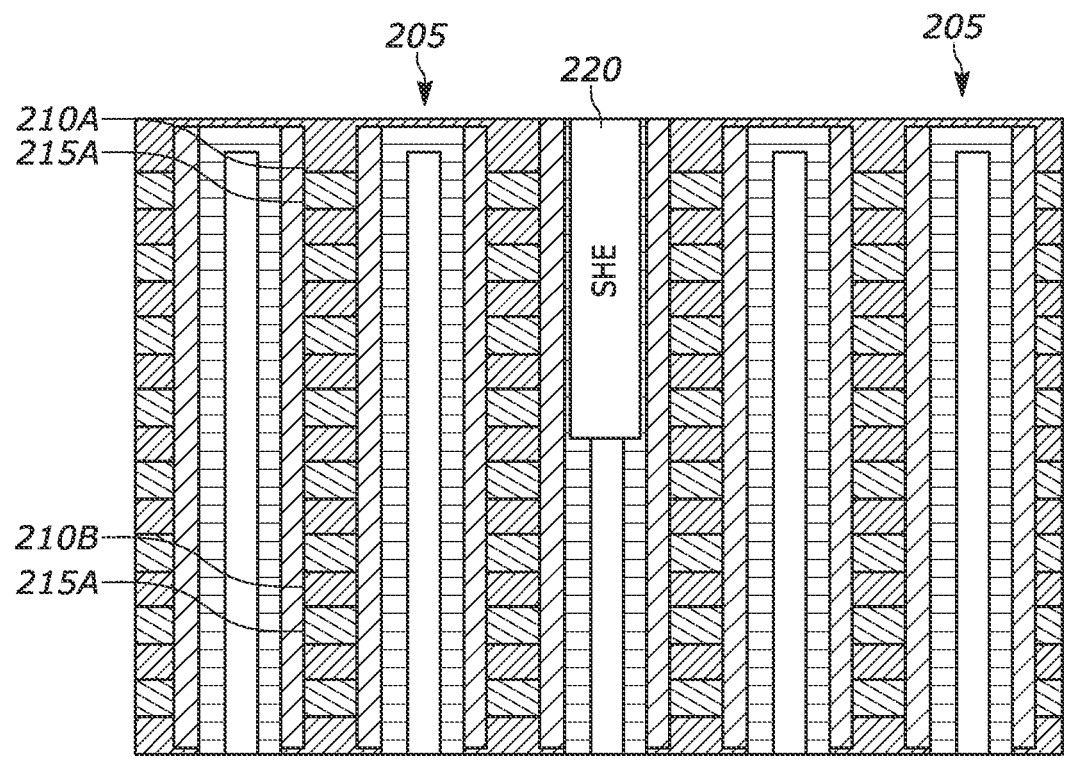
FIG. 2B is a side view of the plurality of memory holes of FIG. 2A, in accordance with some embodiments of the disclosure.

FIGS. 2A-2B illustrates a memory block 200 comprising a plurality of memory holes 205 according to one example. Each memory hole 205 forms a memory cell for every word line. The memory block 200 includes alternating layers of metal 210 and oxide 215 between each memory hole 205. Each of these metal 210 and oxide 215 combinations form a layer in 3D NAND memory. "Drain-side select gates", or SGDs, and "drain-side select gate tops", or SGDTs, are present towards the top of the stack (such as metal 210A and oxide 215A) and are used to either connect or disconnect the memory holes to the drain terminal. For purposes of clarity, only a few representative memory holes 205 are labeled. To read data stored in a memory hole 205, the respective SGD is turned "ON" by being provided a predetermined voltage.

The memory block 200 may be partitioned into sections 225 by a separating oxide 220. Each section 225 holds a set of memory holes 205, such as 16 kilobytes (KB) of memory holes 205. However, as seen in FIG. 2A, several memory holes 205 are covered by the separating oxide 220. Such memory holes 205 are not used for storing data. This results in lost space.

Figure 3A:
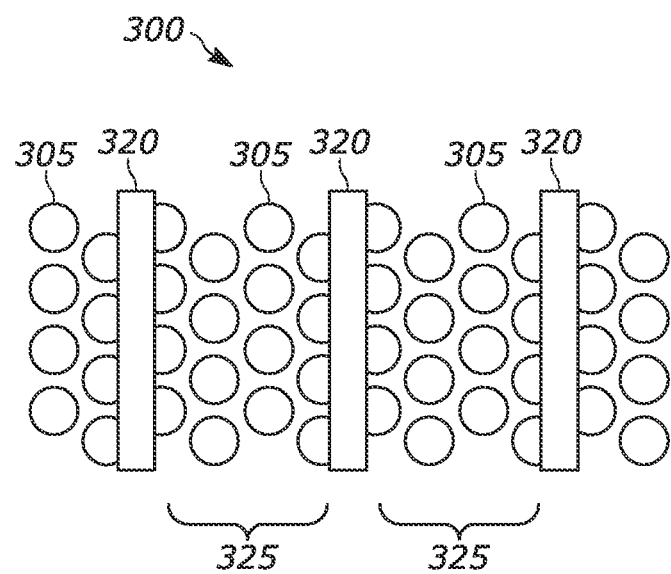
FIG. 3A is a top view of another example of a plurality of memory holes, in accordance with some embodiments of the disclosure.
Figure 3B:
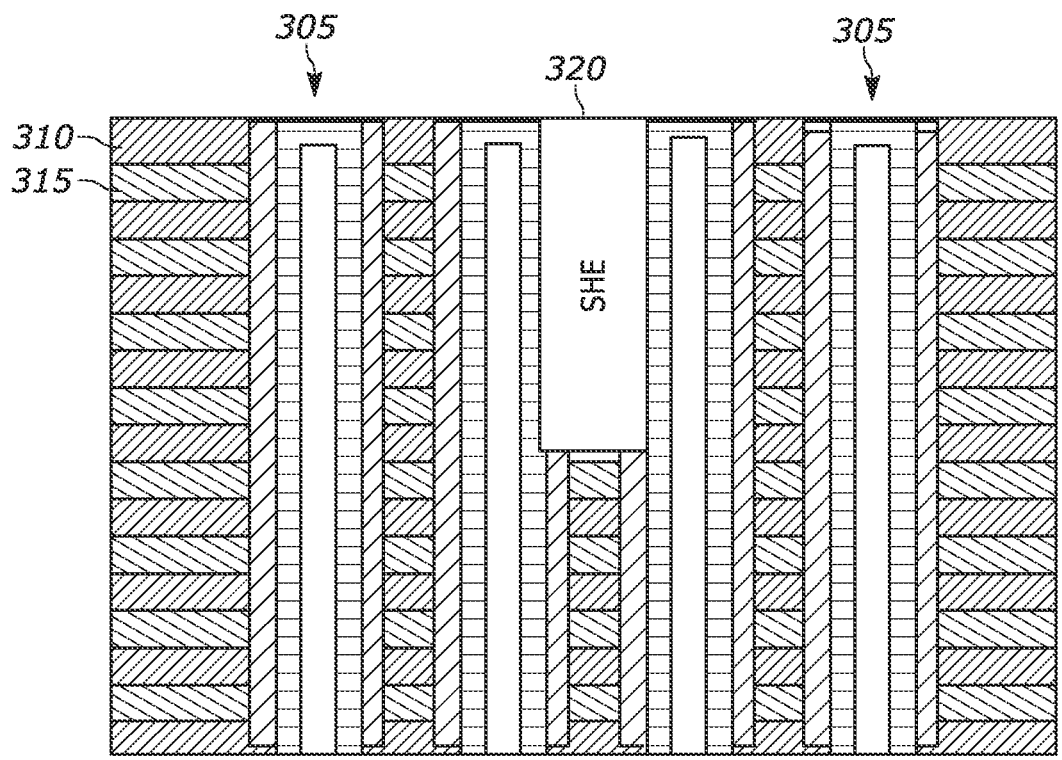
FIG. 3B is a side view of the plurality of memory holes of FIG. 3A, in accordance with some embodiments of the disclosure.

To better utilize the memory holes, FIGS. 3A-3B illustrate a memory block 300 comprising a plurality of memory holes 305. Similar to the memory block 200, the memory block 300 includes alternating layers of metal 310 and oxide 315 between each memory hole 305. Additionally, for the purposes of clarity, only a few representative memory holes 305 are labeled. The memory block 300 is partitioned into sections 325 by a separating oxide 320. However, in the example of FIGS. 3A-3B, the separating oxide 320 is placed between several memory holes 305. This alters the shape of the respective memory holes 305, changing them from substantially circular to substantially semi-circular (e.g., an incomplete circle). The extent to which the respective memory holes 305 are "cut" is dependent on the size of the separating oxide 320. This placement of the separating oxide 320 better utilizes the available memory holes 305. However, when a cell is subjected to large quantities of read disturb events (e.g., cumulative read disturb), the voltage thresholds of the memory dies experiences a shift in value (e.g., downshift effect).

Figure 4:
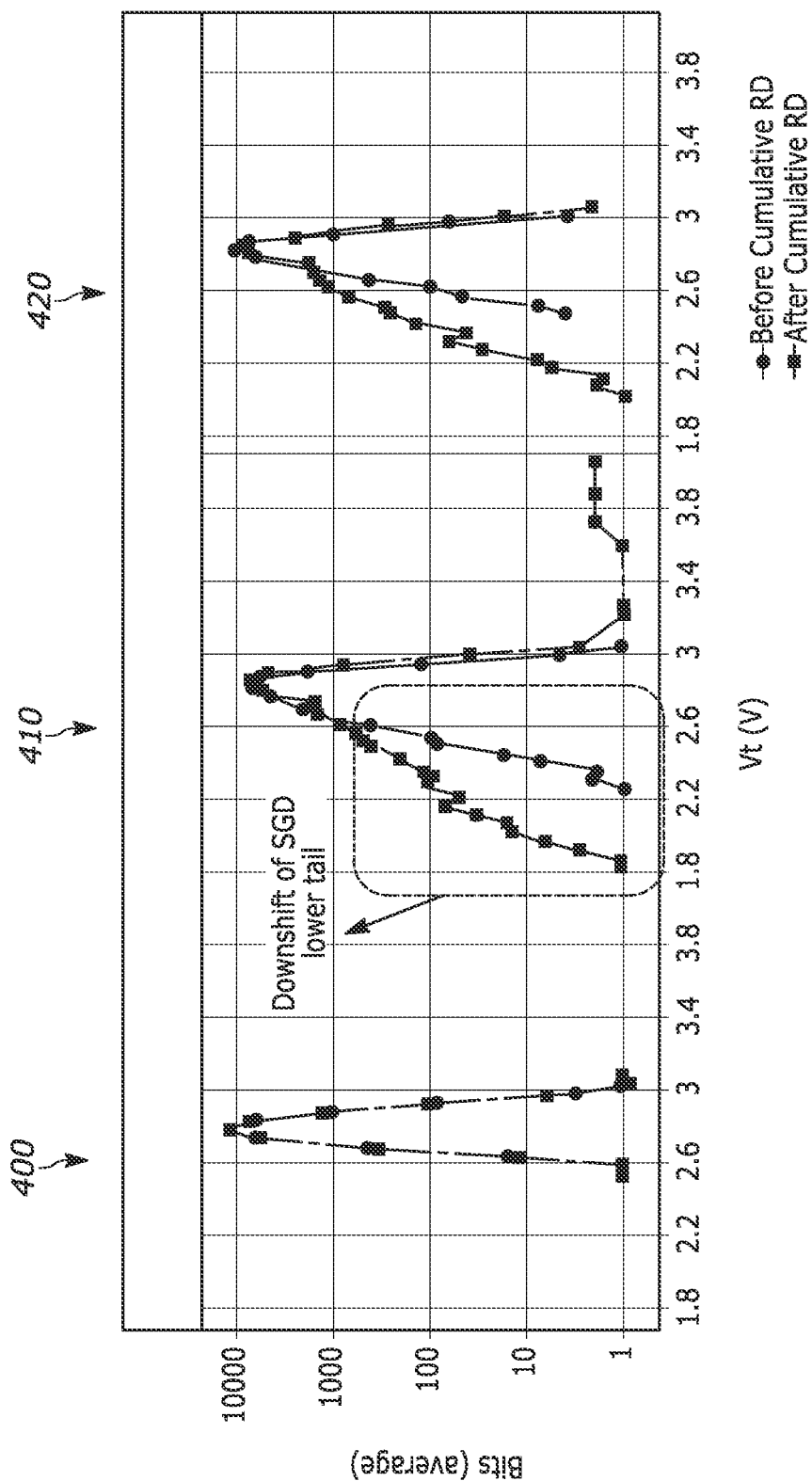
FIG. 4 is a graph of voltage threshold distributions before and after read disturb events, in accordance with some embodiments of the disclosure.

FIG. 4 provides several graphs illustrating the impact of cumulative read disturb on the voltages of memory holes 305. As a block is read multiple times, the SGD cells experience a downshift in their voltage value. For example, FIG. 4 includes a first graph 400 showing the SGD voltage distribution for the structure shown in FIGS. 2A and 2B, a second graph 410 illustrating the SGD voltage distribution for the structure shown in FIGS. 3A and 3B with a particular process, and a third graph 420 also illustrating the SGD voltage distribution for the structure shown in FIGS. 3A and 3B, but with a different process. The SGD voltage distributions in the second graph 410 and the third graph 420 experience voltage downshifts after cumulative read disturb compared to the distribution of the first graph 400, which does not involve semi-circular memory holes. The cumulative read disturb may be, for example, 100,000 cumulative read disturb events. As a result, during subsequent erase program cycles, a high number of noisy bits is present, resulting in increased fail bit count events.

Figure 5A:
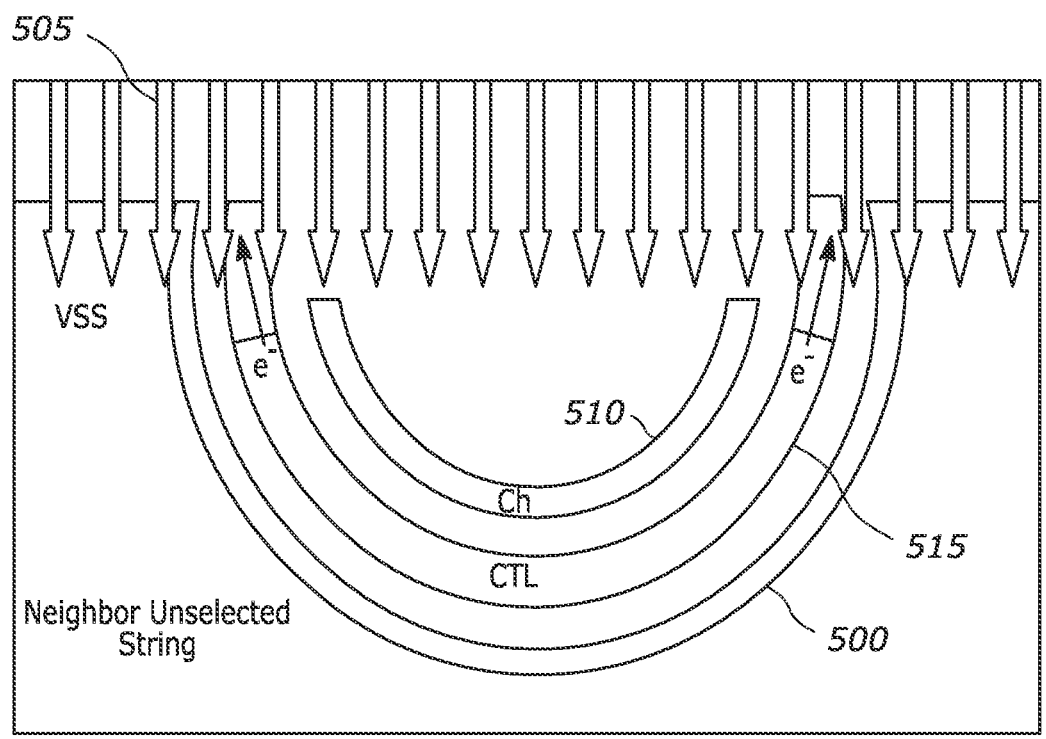
FIGS. 5A-5B are an example memory hole experiencing voltage threshold downshift, in accordance with some embodiments of the disclosure.
Figure 5B:
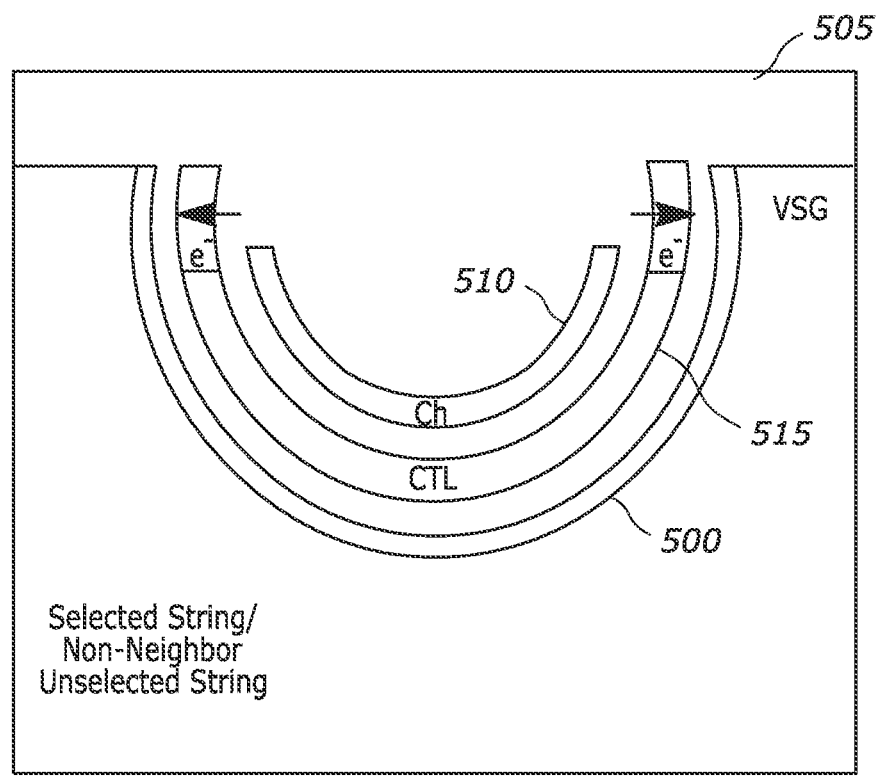

FIGS. 5A and 5B further illustrate SGDs experiencing the voltage downshift effect. Specifically, FIGS. 5A and 5B provide a memory hole 500 cut by a separating oxide 505. The memory hole includes a channel 510 and a charge trap layer (CTL) 515. In some embodiments, the edges of the CTL 515 may be damaged due to being cut by the separating oxide 505. In some embodiments, the channel 510 may also be recessed into the memory hole 500 due to being cut by the separating oxide 505.

In FIG. 5A, the memory hole 500 represents an unselected string of memory holes within the memory block 300. When a neighboring memory hole (not shown) is selected, the electric field due to a high bias voltage (VSG) of the SGD of the neighboring string attracts the electrons in the CTL 515 of the un-selected memory hole 500 towards the separating oxide 505, as shown in FIG. 5A. However, since the channel 510 is recessed, there is no portion of channel 510 adjacent to the CTL 515 near the separating oxide 505, and the SGD voltage threshold downshifts in value. Cumulative read disturb results in continued shift of electrons within the CTL. Additionally, as higher VSG results in a stronger electrical field, a high VSG can worsen the impact of cumulative read disturb.

In FIG. 5B, the memory hole 500 represents a selected string of memory holes within the memory block 300. When the memory hole 500 is selected, the VSG is applied to the memory hole 500. This creates an electric field that attracts electrons within the CTL 515 towards the VSG. This electric field may pull electrons away from the channel 510, and the SGD voltage threshold downshifts in value.

Accordingly, while placing the separating oxide 320 between several memory holes 305 increases total memory space, the impact of the separating oxide 320 on the memory holes 305 over cumulative read disturb is an SGD voltage downshift on the respective memory holes 305. This results in a high number of noisy bits and an increased fail bit count. As VSG increases, the noise increases, and data that is read may be different than data that is stored. Memory dies with lower VSG experience less impact of the electric field, and therefore experience less voltage downshift. The VSG for a memory die may be selected as the minimum possible VSG value to yield a voltage margin for the voltage distribution of the memory die above a fixed threshold (or yielding a failed bit count lower than a fixed threshold) after it is subjected to a predetermined number of read events followed by an erase and subsequent program. This value varies between memory dies.

Managing and Offsetting Downshift Effect

Figure 6:
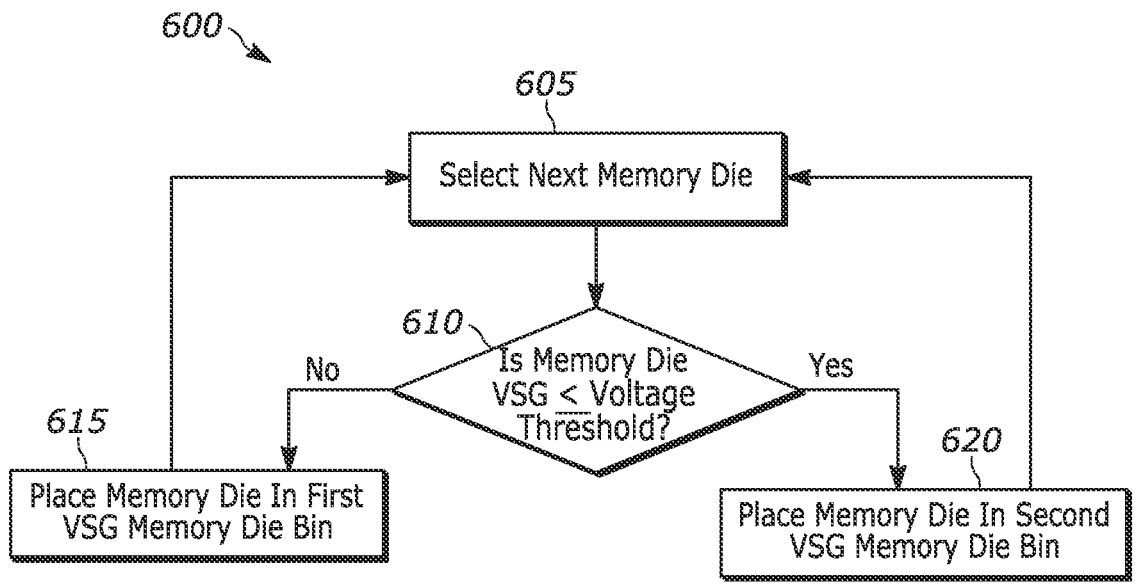
FIG. 6 is an example method of organizing memory dies, in accordance with some embodiments of the disclosure.

Since memory dies with lower VSG experience less voltage downshift than memory dies with higher VSG, they may be sorted according to their VSG. Memory dies that are more susceptible to voltage downshift may then be implemented in devices that are less read-intensive. FIG. 6 provides a method 600 for sorting memory dies. In some implementations, the method 600 is performed during an initial memory die sorting stage during production of the data storage device 102 (e.g., performed by a manufacturing controller that controls the packaging of the memory dies into the data storage device 102).

The method 600 includes selecting the next memory die (at block 605). In an instance where sorting of the memory dies has just been initiated and no memory dies have been sorted, an initial (e.g., a first) memory die may be selected. The memory dies may be, for example, the memory units 107A-107N within the memory 104. The method 600 includes determining whether the VSG of the selected memory die is less than or equal to a first voltage threshold (at decision block 610). The voltage threshold may be, for example, 4.6 V. In some implementations, the voltage threshold is selected such that the lowest available VSG is greater than the SGD upper tail voltage by an overdrive value A.

When the VSG of the selected memory die is not less than or equal to the first voltage threshold ("NO" at decision block 610), the method 600 includes placing the memory die in a first VSG memory die bin (at block 615). The first VSG memory die bin includes memory dies with VSG greater than the first voltage threshold. Accordingly, the memory dies in the first VSG memory die bin may be more susceptible to the impacts of downshift effect. The memory dies in the first VSG memory die bin may be implemented in products which are less read intensive so as to avoid cumulative read disturb.

When the VSG of the selected memory die is less than or equal to the first voltage threshold ("YES" at decision block 610), the method 600 includes placing the memory die in a second VSG memory die bin (at block 620). As the memory dies in the second memory die bin are less than or equal to the first voltage threshold, the memory dies in the second memory die bin may be less susceptible to the impacts of downshift effect. Accordingly, the memory dies in the second memory die bin may be implemented in products which are more read intensive.

Once the memory die is placed in either the first VSG memory die bin or the second VSG memory die bin (at block 615 or block 620), the method 600 includes returning to block 605 and selecting the next memory die to sort.

Figure 7:
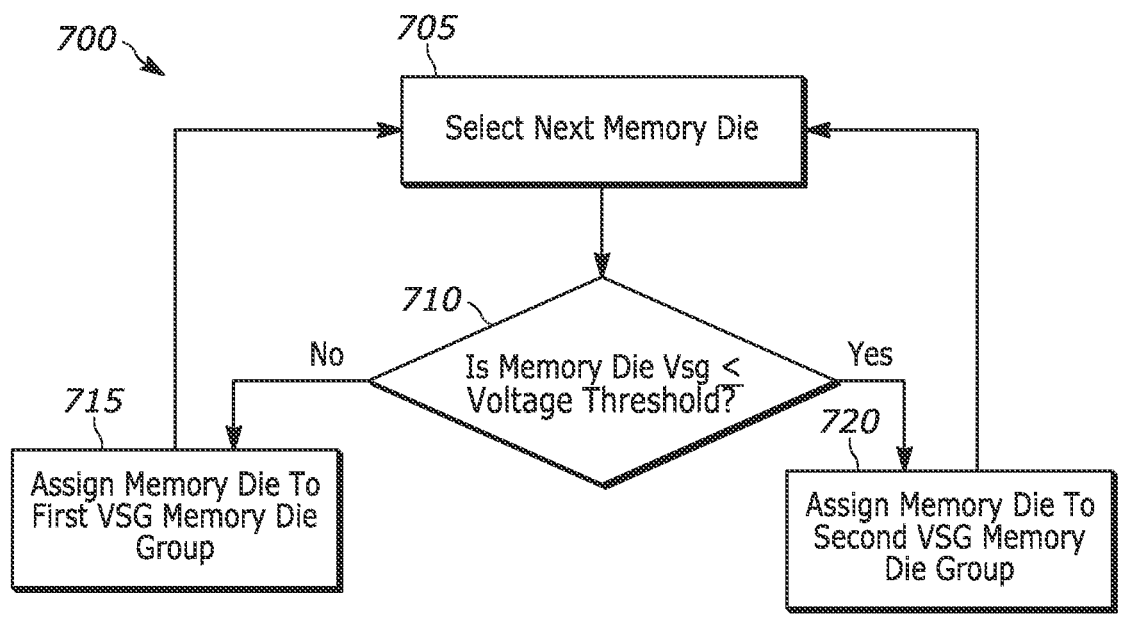
FIG. 7 is an example method of organizing memory dies during initial die sorting, in accordance with some embodiments of the disclosure.

While method 600 is directed to sorting memory dies during production of the data storage device 102, the memory dies may instead be sorted logically by the data storage device controller 106. FIG. 7 provides a method 700 for sorting memory dies into memory die groups based on their VSG. The data storage device controller 106 may perform the method 700 during an initial set-up and prior to storing any data in the memory 104. In some implementations, the data storage device controller 106 implements the memory die management module 124 to perform the method 700.

The method 700 includes selecting, with the data storage device controller 106, the next memory die (at block 705). In an instance where sorting of the memory dies has just been initiated and no memory dies have been sorted, an initial (e.g., a first) memory die may be selected. The memory dies may be, for example, the memory units 107A-107N within the memory 104. The method 700 includes determining, with the data storage device controller 106, whether the VSG of the selected memory die is less than or equal to a first voltage threshold (at decision block 710). The voltage threshold may be, for example, 4.6 V. In some implementations, the voltage threshold is selected such that the lowest available VSG is greater than the SGD upper tail voltage by an overdrive value Δ.

When the VSG of the selected memory die is not less than or equal to the first voltage threshold ("NO" at decision block 710), the method 700 includes assigning, with the data storage device controller 106, the memory die to a first VSG memory die group (at block 715). Memory dies assigned to the first VSG memory die group may be more susceptible to the impacts of downshift effect. Accordingly, the memory dies assigned to the first VSG memory die group may store data that is less read intensive.

When the VSG of the selected memory die is less than or equal to the first voltage threshold ("YES" at decision block 710), the method 700 includes assigning, with the data storage device controller 106, the memory die to a second VSG memory die group (at block 720). Memory dies assigned to the second VSG memory die group may be less susceptible to the impacts of downshift effect. Accordingly, the memory dies assigned to the second VSG memory die group may store data that is more read intensive.

Once the memory die is assigned to either the first VSG memory die group or the second VSG memory die group (at block 715 or block 720), the method 700 includes returning, to block 705 and selecting, with the data storage device controller 106, the next memory die to sort.

Figure 8:
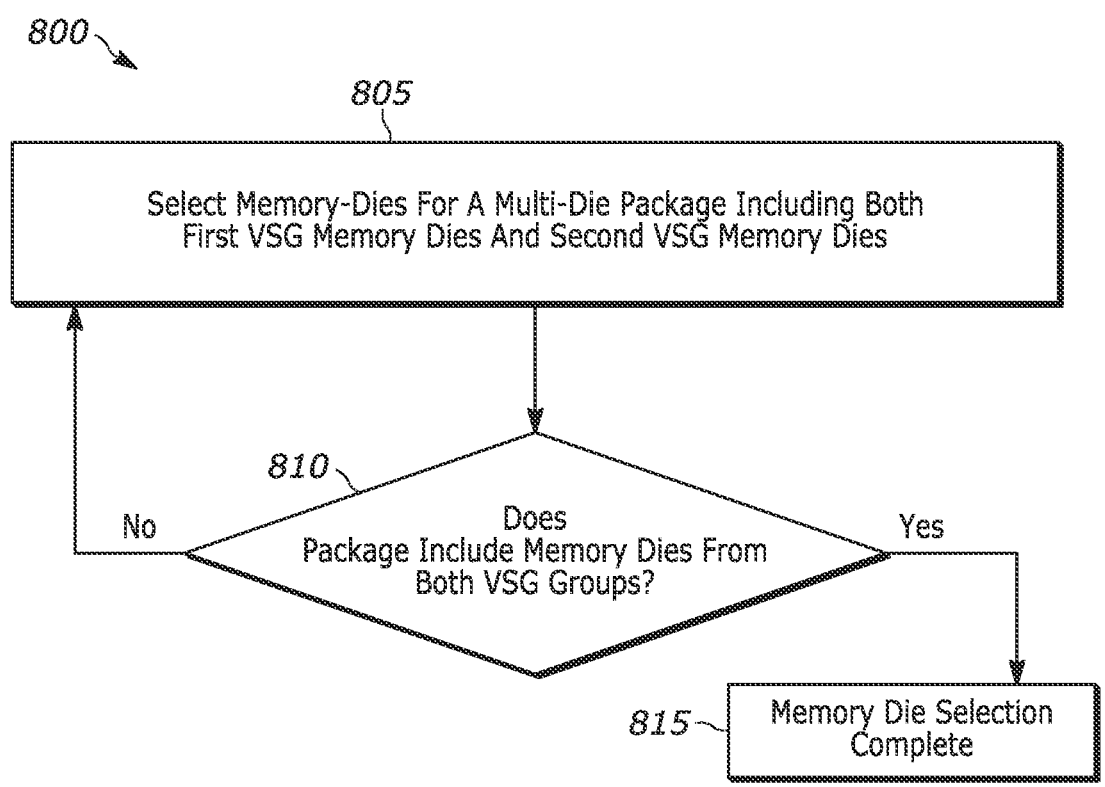
FIG. 8 is an example method of organizing memory dies during packaging, in accordance with some embodiments of the disclosure.

To ensure a memory die package is capable of handling both read intensive data and non-read intensive data, dies assigned to both the first VSG memory die group and the second VSG memory die group may be stacked within a memory package. FIG. 8 provides a method 800 of sorting memory dies during packaging. In some implementations, the data storage device controller 106 performs the method 800 during packaging of the memory dies. The data storage device controller 106 may implement the memory die management module 124 to perform the method 800.

The method 800 includes selecting, with the data storage device controller 106, memory dies for a multi-die memory package including both dies from both the first VSG memory die group and the second VSG memory die group (at block 805). For example, the data storage device controller 106 includes at least one die from the first VSG memory die group and at least one of the second VSG memory die group in a multi-die package.

The method 800 includes determining, with the data storage device controller 106, whether the multi-die package includes memory dies from both the first VSG memory die group and the second VSG memory die group (at decision block 810). In some instances, the data storage device controller 106 ensures a particular ratio of memory dies from the first VSG memory die group and memory dies from the second VSG memory die group is satisfied. As one example, the data storage device controller 106 may ensure there are twice as many memory dies from the first VSG memory die group included in the multi-die package than memory dies from the second VSG memory die group. In other instances, the ratio of memory dies from the first VSG memory die group and memory dies from the second VSG memory die group may be a variable ratio that is varied to meet the requirements of a particular application. In yet other instances, the ratio of memory dies from the first VSG memory die group and memory dies from the second VSG memory die group may be a predetermined fixed ratio.

When the multi-die package does not include memory dies from both the first VSG memory die group and the second VSG memory die group ("NO" at decision block 810), the method 800 includes returning, with the data storage device controller 106, to block 805. When the multi-die package does include memory dies from both the first VSG memory die group and the second VSG memory die group ("YES" at decision block 810), the method 800 includes completing, with the data storage device controller 106, the memory die selection process (at block 815).

Figure 9:
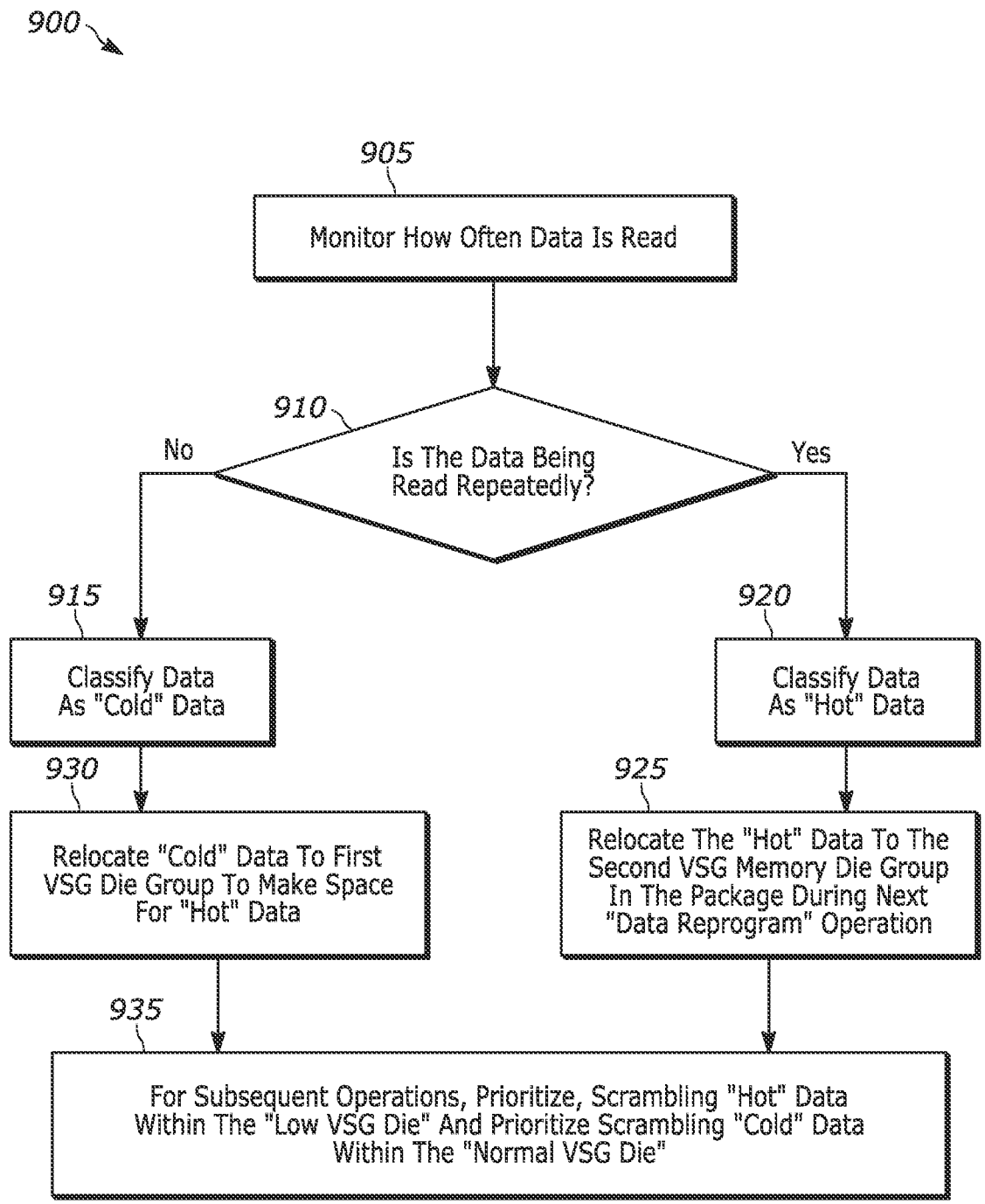
FIG. 9 is an example method of organizing memory dies during operation, in accordance with some embodiments of the disclosure.

After the data storage device 102 is manufactured and storing data, the data storage device controller 106 may distribute data between memory dies of the first VSG memory dies and the second VSG memory dies based on how often the data is read. FIG. 9 provides a method 900 for allocating data within the memory dies based on how often the data is read. In some implementations, the data storage device controller 106 performs the method 900. The data storage device controller 106 may implement the memory die management module 124 to perform the method 900.

The method 900 includes monitoring, with the data storage device controller 106, how often data stored in a memory die (e.g., a memory unit 107A-107N) is read (at block 905). The method 900 includes determining, with the data storage device controller 106, whether the data stored in the memory die is being read repeatedly (at decision block 910). As one example, the data storage device controller 106 compares how often data stored in the memory die is read (e.g., a cumulative read occurrence) to a read threshold. The read threshold may indicate a number of reads over time, such as, for example, 10,000 reads in an hour.

When the data stored in the memory die is not being read repeatedly ("NO" at decision block 910), method 900 includes classifying, with the data storage device controller 106, the data as "cold" data (at block 915). For example, the read events over time of the data stored in the memory die is less than the read threshold. When the data stored in the memory die is being read repeatedly ("YES" at decision block 910), the method 900 includes classifying, with the data storage device controller 106, the data as "hot" data (at block 920). For example, the read events over time of the data stored in the memory dies is greater than or equal to the read threshold.

After classifying the data as "hot" data (at block 920), the method includes relocating, with the data storage device controller 106, the "hot" data to the second VSG memory die group in the multi-die package during the next "Data Re-Program" Operation (at block 925). For example, during a "Data Re-Program" Operation, the data storage device controller 106 ensures that data experiencing a high number of read events (e.g., cumulative read disturb) is stored within VSG memory dies with a lower VSG value. The "Data Re-Program" Operation may occur at set frequencies, such as once a day, once a week, once a month, or the like. In some instances, the "Data Re-Program" Operation occurs as soon as data is identified as "hot." Should "hot" data be stored in a memory die within the first VSG memory die group, the data storage device controller 106 relocates the data to the second VSG memory die group.

Figure 10:
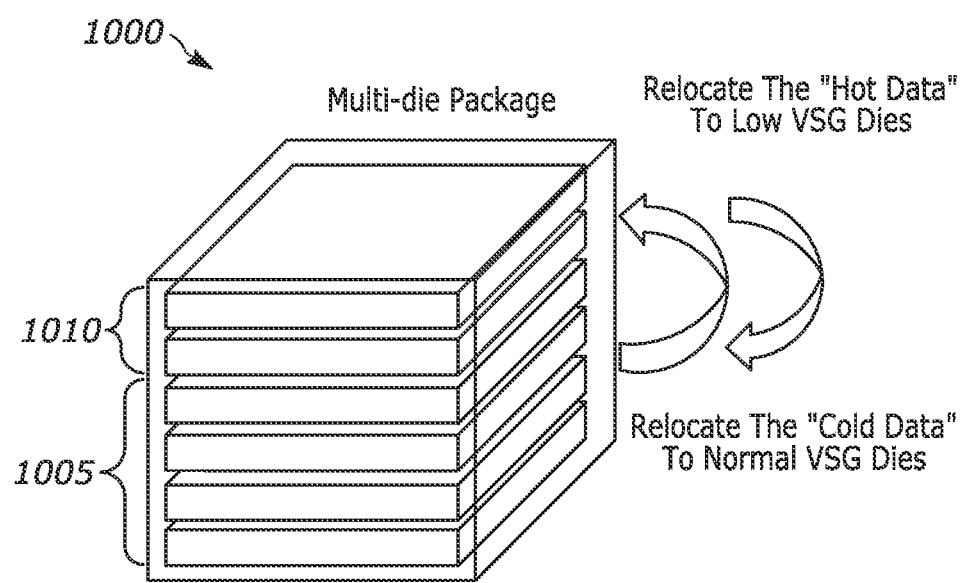
FIG. 10 is an example multi-die memory package, in accordance with some embodiments of the disclosure.

As one example, FIG. 10 provides a multi-die package 1000 including a first VSG memory die group 1005 and a second VSG memory die group 1010. The first VSG memory die group 1005 includes memory dies with a VSG greater than the voltage threshold (at block 715 of FIG. 7), and the second VSG memory die group 1010 includes memory dies with a VSG less than or equal to the voltage threshold (at block 720 of FIG. 7). Should data within the first VSG memory die group 1005 be identified as "hot" data, the data storage device controller 106 relocates the "hot" data to the second VSG memory die group 1010.

Returning to FIG. 9, after classifying the data as "cold" data (at block 915), the method 900 includes relocating, with the data storage device controller 106, the "cold" data to the first VSG memory die group in the multi-die package (at block 930). As "hot" data is moved to memory dies in the second VSG memory die group, the space available to store data within the second VSG memory die group decreases. Accordingly, "cold" data that experiences less read events may be moved from memory dies within the second VSG memory die group to memory dies within the first VSG memory die group. Relocation of the "cold" data to the first VSG memory die group may occur during the "Data Re-Program" Operation, or may occur at a time when data is not actively being stored or read by the data storage device controller 106. In some implementations, the "cold" data is relocated to the first VSG memory die group when the data storage device controller 106 detects that the second VSG memory die group has insufficient space (or is approaching having insufficient space) for storing new data. With reference to FIG. 10, the data storage device controller 106 relocates the "cold" data from the second VSG memory die group 1010 to the first VSG memory die group 1005.

After relocating the "cold" data and "hot" data at blocks 930 and 925, respectively, the method 900 includes prioritizing, with the data storage device controller 106, scrambling (e.g., randomizing) "hot" data within the second VSG die group and scrambling "cold" data within the first VSG die group during subsequent "Data Re-Program" Operations. Scrambling data may include relocating (or transferring) the data to a different memory block. By scrambling the data within their respective VSG die groups, the data storage device controller 106 maintains storage space within the VSG die groups for additional data to be stored. In some instances, scrambling is performed in response to an increase in failed bits or another similar abnormal condition of the data stored within a block.

In some instances, memory dies within the first VSG die group and the second VSG die group are stacked in the order of their VSG values. For example, when the voltage threshold (at decision block 710) is 4.7 V, the first VSG die group may include memory dies having VSG values ranging from 4.8 V to 7.4 V, and the second VSG die group may include memory dies having VSG values ranging from 3.8 V to 4.7 V. The memory dies may then be stacked from lowest VSG value (3.8 V) to the highest value (4.7 V) within the second VSG die group, and stacked from lowest value (4.8 V) to the highest value (7.4 V) within the first VSG die group. In other implementations, the memory dies are scrambled within the first VSG die group and the second VSG die group such that the VSG values of the memory dies are randomized.

Additionally, in some instances, the memory dies within the multi-die package are stacked alternating according to their VSG die group. For example, a die in the first VSG die group may be sandwiched between two dies in the second VSG die group, and a die in the second VSG die group may be sandwiched between two dies in the first VSG die group.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
   a memory interface configured to interface with a non-volatile memory, the non-volatile memory including a plurality of memory dies, each of the memory dies including a bias voltage value; and
   an electronic processor configured to:
   compare the bias voltage value of each of the memory dies to a voltage threshold,
   assign memory dies having a bias voltage value greater than the voltage threshold to a first group of memory dies,
   assign memory dies having a bias voltage value less than or equal to the voltage threshold to a second group of memory dies, store data within a memory die of the plurality of memory dies, determine a cumulative read occurrence of the data, compare the cumulative read occurrence of the data to a read threshold, classify, when the cumulative read occurrence is greater than or equal to the read threshold, the data as hot data, and classify, when the cumulative read occurrence is less than the read threshold, the data as cold data.

2. The data storage device of claim 1, wherein the plurality of memory dies form a multi-die package including a first set of memory dies from the first group of memory dies, and a second set of memory dies from the second group of memory dies.

3. The data storage device of claim 2, wherein the multi-die package is formed by alternating stacking memory dies from the first set of memory dies and memory dies from the second set of memory dies.

4. The data storage device of claim 1, wherein the electronic processor is further configured to:

relocate the hot data to the second group of memory dies, and relocate the cold data to the first group of memory dies.

5. The data storage device of claim 1, wherein the electronic processor is further configured to:

scramble the hot data within the second group of memory dies, and scramble the cold data within the first group of memory dies.

* * * * *